United States Patent
Eskildsen et al.

(10) Patent No.: US 8,999,763 B2
(45) Date of Patent: Apr. 7, 2015

(54) PACKAGE INCLUDING AN INTERPOSER HAVING AT LEAST ONE TOPOLOGICAL FEATURE

(71) Applicant: Micron Technology, Inc., Boise, ID (US)

(72) Inventors: Steven Eskildsen, Folsom, CA (US); Aravind Ramamoorthy, Roseville, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/300,130

(22) Filed: Jun. 9, 2014

(65) Prior Publication Data

US 2014/0287558 A1    Sep. 25, 2014

Related U.S. Application Data

(62) Division of application No. 12/628,006, filed on Nov. 30, 2009, now Pat. No. 8,749,074.

(51) Int. Cl.
| | |
|---|---|
| *H01L 21/00* | (2006.01) |
| *H01L 21/56* | (2006.01) |
| *H01L 23/31* | (2006.01) |
| *H01L 23/495* | (2006.01) |
| *H01L 23/00* | (2006.01) |

(52) U.S. Cl.
CPC .......... *H01L 21/561* (2013.01); *H01L 23/3107* (2013.01); *H01L 23/3142* (2013.01); *H01L 23/49531* (2013.01); *H01L 23/562* (2013.01); *H01L 2924/0002* (2013.01)

(58) Field of Classification Search
CPC .... H01L 23/13; H01L 23/3142; H01L 23/315
USPC .......... 438/124, 126, 127; 257/787, E23.127, 257/E23.128, E23.131, E23.036
See application file for complete search history.

(56) References Cited

U.S. PATENT DOCUMENTS

| | | | |
|---|---|---|---|
| 5,336,456 A | 8/1994 | Eskildsen et al. | |
| 5,701,034 A | 12/1997 | Marrs | |
| 6,268,644 B1 * | 7/2001 | Umehara et al. | 257/667 |
| 6,548,328 B1 * | 4/2003 | Sakamoto et al. | 438/121 |
| 6,750,546 B1 | 6/2004 | Villanueva et al. | |
| 7,541,669 B2 | 6/2009 | Carberry et al. | |
| 2004/0056337 A1 | 3/2004 | Hasebe et al. | |
| 2006/0189031 A1 | 8/2006 | Kado et al. | |
| 2006/0289989 A1 | 12/2006 | Yee et al. | |
| 2008/0067699 A1 | 3/2008 | Tamaki | |
| 2008/0220564 A1 * | 9/2008 | Mahler et al. | 438/109 |
| 2009/0068799 A1 * | 3/2009 | Shen et al. | 438/127 |
| 2009/0309201 A1 | 12/2009 | Morita | |
| 2010/0059898 A1 | 3/2010 | Keeth et al. | |
| 2010/0258921 A1 | 10/2010 | Chang Chein et al. | |
| 2011/0124159 A1 * | 5/2011 | Tanoue | 438/123 |
| 2011/0127659 A1 | 6/2011 | Eskildsen et al. | |

* cited by examiner

*Primary Examiner* — Kimberly Rizkallah
*Assistant Examiner* — Maria Ligai
(74) *Attorney, Agent, or Firm* — Perkins Coie LLP

(57) ABSTRACT

Embodiments include but are not limited to apparatuses and systems including semiconductor packages, e.g. memory packages, having an interposer including at least one topological feature, such as a depression in a surface of the interposer, a die coupled to the surface of the interposer, and an encapsulant material formed over the die and the interposer, and disposed in the at least one depression to resist movement of the encapsulant material relative to the interposer. Other embodiments may be described and claimed.

14 Claims, 7 Drawing Sheets

PACKAGE INCLUDING AN INTERPOSER HAVING AT LEAST ONE TOPOLOGICAL FEATURE

CROSS-REFERENCE TO RELATED APPLICATION

This application is a divisional of U.S. patent application Ser. No. 12/628,006, filed Nov. 30, 3009, now U.S. Pat. No. 8,749,074, which is incorporated herein by reference in its entirety.

BACKGROUND

An interposer may be used for rearranging and coordinating the position and sequence of die bond pad signals between a die and a lead frame. To form a package, an encapsulant material is formed over the die, the interposer, and at least part of the lead frame. The various elements, however, may have different coefficients of thermal expansion, which may result in static force stress during temperature cycling.

BRIEF DESCRIPTION OF THE DRAWINGS

Subject matter is particularly pointed out and distinctly claimed in the concluding portion of the specification. The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

Figure 1:
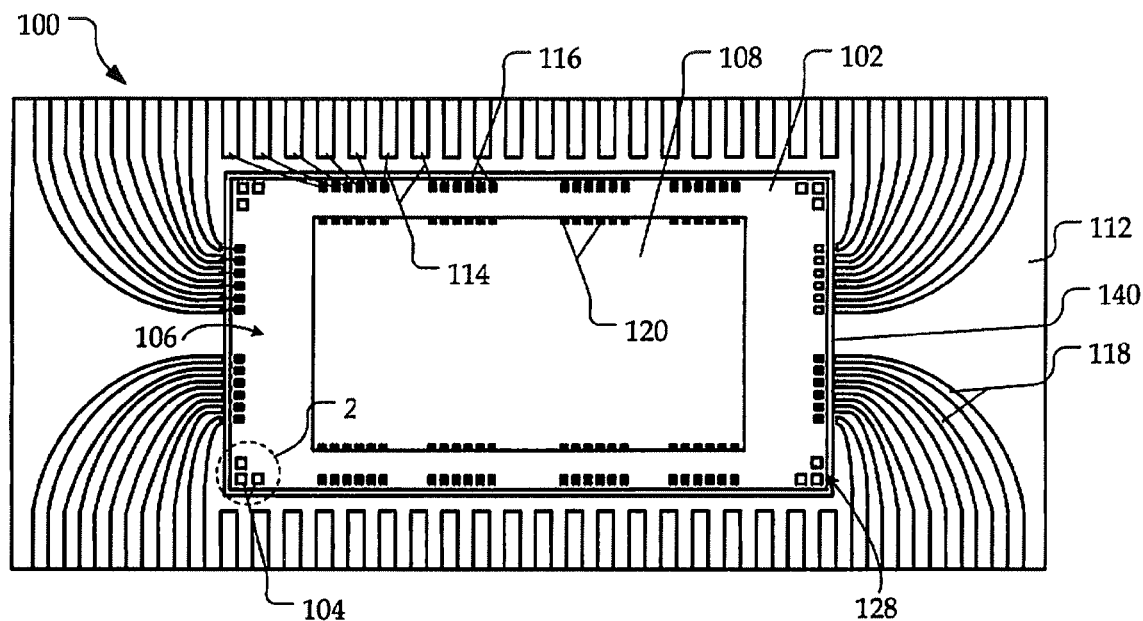
FIG. 1 illustrates an example apparatus comprising an interposer including at least one depression in a surface of the interposer.

all arranged in accordance with various embodiments of the present disclosure.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to a package including an interposer including at least one depression in a surface of the interposer. Embodiments include, but are not limited to, methods, apparatuses, and systems. Other embodiments may also be disclosed and claimed.

The present disclosure recognizes that temperature cycling can cause different materials of a package with different coefficients of thermal expansion to expand and/or contract at different rates, and that static force stress may increase as the distance from the center of the package increases. The present disclosure further recognizes that thermal-induced stress may result in delamination between the mold compound and surface of interposer, and/or other damage to the circuit including, for example, broken wire bonds.

The present disclosure is drawn to an apparatus that may avoid an impact of thermal-induced stress to a package by including at least one depression in a surface of the interposer of the package. An encapsulant material may be formed over the die and the interposer, and disposed in the at least one depression to resist movement of the encapsulant material relative to the interposer.

Figure 2:
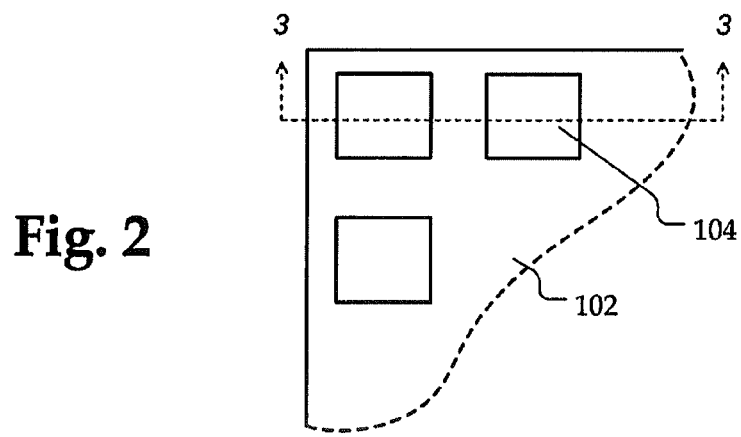
FIG. 2 illustrates a magnified view of a portion of the interposer of FIG. 1.
Figure 3:
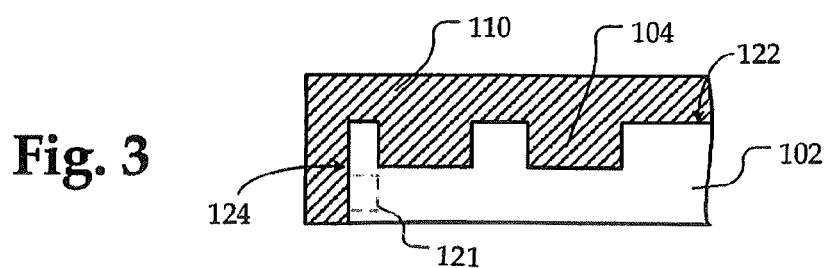
FIG. 3 illustrates a cross-sectional view of the magnified view of FIG. 2 taken along line 3-3.

FIG. 1 illustrates an example apparatus 100 comprising an interposer 102 including at least one topological feature such as a depression 104 in a surface 106 of the interposer 102, arranged according to at least some embodiments described herein, while FIG. 2 illustrates a magnified view of a portion of the interposer 102 of FIG. 1. FIG. 3 illustrates a cross-sectional view of the magnified view of FIG. 2 taken along line 3-3.

As illustrated, a die 108 may be coupled to the surface 106 of the interposer 102. An encapsulant material 110 may be formed over the die 108 and the interposer 102 (not illustrated in FIGS. 1 and 2, for clarity), and disposed in the at least one depression 104 to resist movement of the encapsulant material 110 relative to the interposer 102. The at least one depression 104 may allow the encapsulant material 110 to have a mechanical structure to which to adhere in addition to the chemical bond between the encapsulant material 110 and the interposer 102. The at least one depression 104 may be configured such that the edge(s) are substantially orthogonal or, in some embodiments, have relatively steep angles for example, more than 45 degrees) with respect to the plane of the interposer 102. The encapsulant material 110 may be effectively locked by the z-dimensional structure of the depression 104 to resist movement.

The interposer 102 and die 108 may be coupled to any suitable leaded or leadless lead frame or carrier substrate. For the illustrated embodiment, the interposer 102 and die 108 is coupled to a die paddle 140 of a lead frame 112. A plurality of bond wires 114 may couple bond pads 116 of the interposer 102 to lead fingers 118 the lead frame 112. Although not illustrated, other bond wires may couple bond pads 120 of the die 108 to the interposer 102.

In the illustrated embodiments, the at least one depression 104 is formed in a top surface 122 of the interposer 102. In various other embodiments, however, the at least one depression 104 may be formed in a side surface 124 or another surface in addition to or instead of the top surface 122.

Figure 4:
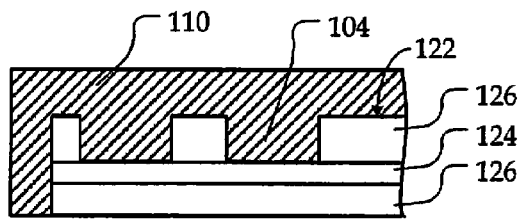
FIG. 4 illustrates another example cross-sectional of the magnified view of FIG. 2 taken along line 3-3.
Figure 5:
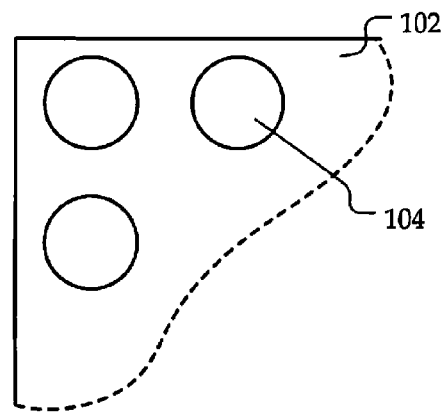
FIG. 5 illustrates another example configuration for the depressions in the interposer.
Figure 6:
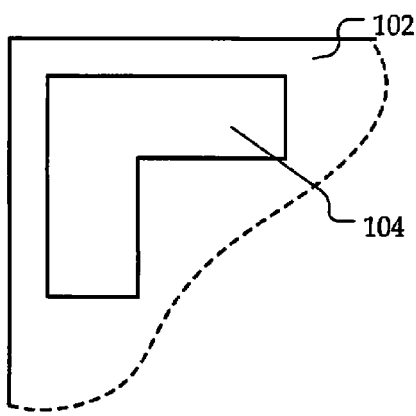
FIG. 6 illustrates another example configuration for the depressions in the interposer.
Figure 7:
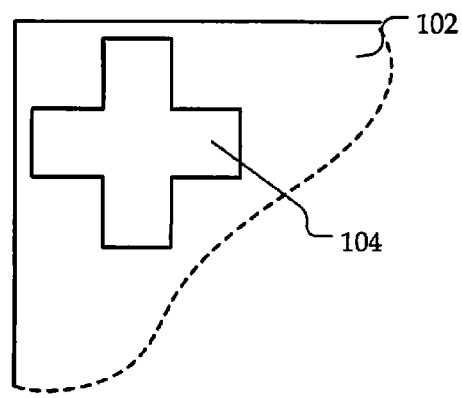
FIG. 7 illustrates another example configuration for the depressions in the interposer.

The interposer 102 may be any suitable interposer configured to rearrange the position and/or sequence of bond pad 120 signals so that signal are coordinated with the signals and/or positions of the lead fingers 118 of the lead frame 112. For such rearrangement, the interposer 102 may include one or more metal layers 124 between one or more soldermask layers 126 as illustrated in FIG. 4. In various embodiments, the The at least one depression 104 may have one or more of a variety of shapes. As illustrated in FIGS. 1 and 2, the at least one depression 104 may comprise a plurality of square-shaped depressions. Other configurations are possible. For example, the at least one depression 104 may comprise one or more circular shaped depressions, as illustrated in FIG. 5, and/or one or more L-shaped depressions, as illustrated in FIG. 6. Another example may include one or more cross-shaped depressions, as illustrated in FIG. 7. Numerous other configurations for the at least one depression 104 are possible.

The at least one depression 104 may be located anywhere on a surface 106 of the interposer 102. As illustrated in FIG. 1, the at least one depression 104 may be located at a corner 128 of the surface 106 of the interposer 102. In various embodiments of packages, a higher level of thermal stress may be associated with corners 128 of the interposer 102 relative to other areas of the interposer 102, and providing the a least one depression 104 at the corner 128 may help minimize the static mechanical stress and/or the impact of any thermal stresses present.

Figure 8:
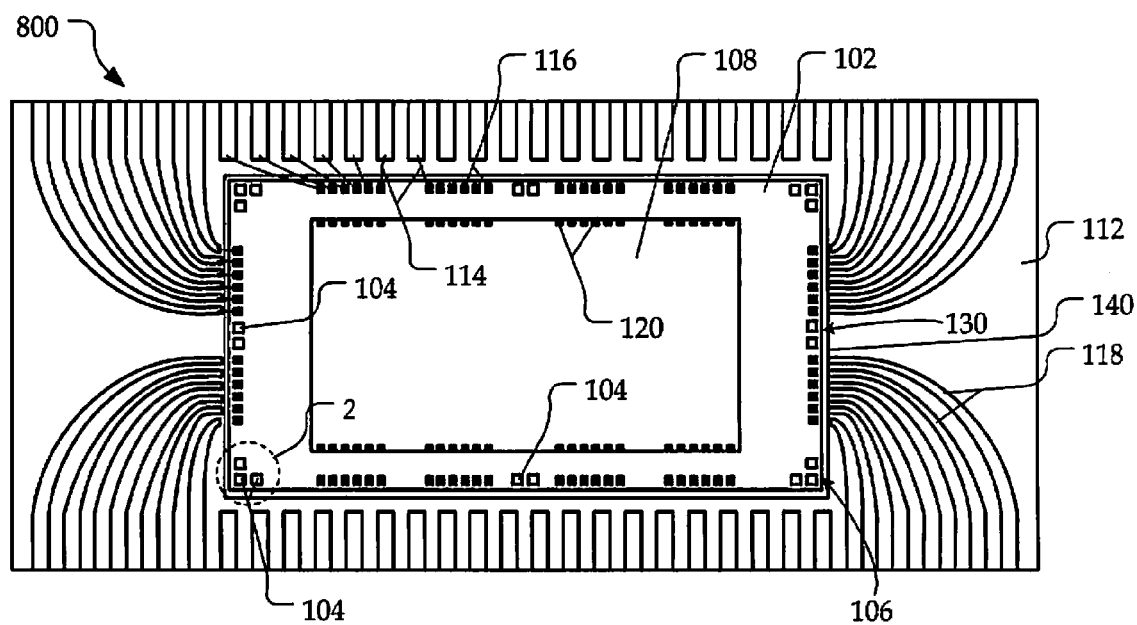
FIG. 8 illustrates another example apparatus comprising an interposer including at least one depression in a surface of the interposer.

In various embodiments, the at least one depression 104 may be located at any other area of the surface 106 of the interposer 102 instead of or addition to the at least one depression 104 at the corner(s) 128 of the interposer 102. FIG. 8 illustrates another example apparatus 800, arranged according to at least some embodiments described herein, wherein at least one depression 104 may be located along at least one edge 130 of the interposer 102.

While the at least one depression 104 may be configured to resist movement of the encapsulant material 110 relative to the interposer 102, eliminating or reducing in number the wire bonds at the corners 106 of the interposer 102 may further avoid an impact of thermally induced mechanical stress to a package including such an interposer 102. In other words, even if the package were to experience delamination and/or other damage from thermal stress, broken wire bonds may be avoided to some extent by eliminating the wire bonds at areas susceptible to thermal stress such as, for example, the corners 106 of the interposer 102. As illustrated in the example apparatuses 100 and 800, at least one corner 106 of the surface 106 of the interposer 102 is free of bond pads 116.

Figure 9:
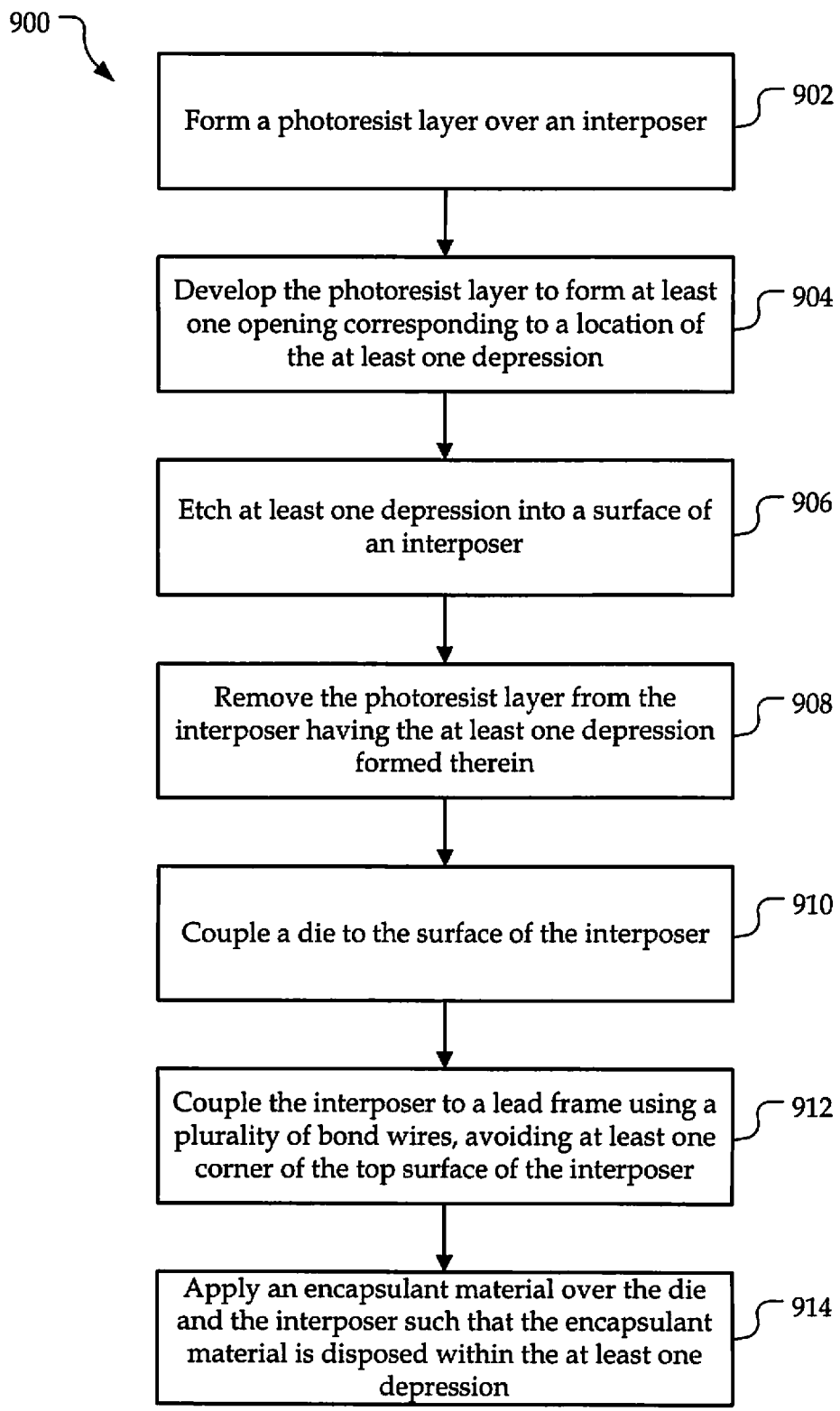
FIG. 9 is a flow diagram illustrating some of the operations associated with an example method of making an apparatus comprising an interposer including at least one depression in a surface of the interposer.

The apparatuses of FIGS. 1-8 may be more clearly understood with reference to FIG. 9. FIG. 9 is a flow diagram illustrating some of the operations associated with an example method of making an apparatus comprising an interposer including at least one depression in a surface of the interposer, arranged in accordance with at least some embodiments of the present disclosure. It should be noted that although the method is illustrated as a series of sequential steps, the method is not necessarily order dependent. Moreover, methods within the scope of this disclosure may include more or fewer steps than that illustrated.

Turning now to FIG. 9, with continued reference to various elements of the apparatuses of FIGS. 1-8, the method 900 may include one or more functions, operations, or actions as is illustrated by any one or more of blocks 902-914. Processing for the method 900 may start with blocks 902 and 904, "Form a photoresist layer over an interposer" and "Develop the photoresist layer to form at least one opening corresponding to a location of the at least one depression," respectively. Any photoresist or other mask layer suitable for photolithographic patterning and etching operations may be used. In some embodiments, a hard mask such as silicon nitride or the like may be suitable. Developing the photoresist layer may include exposing the photoresist layer to suitable activation energy for rendering certain areas (i.e., areas in which the desired depressions 104 in the interposer 102 are desired) of the photoresist layer removable by a suitable solvent or other chemical.

From block 904, method 900 may proceed to blocks 906 and 908, "Etch at least one depression into a surface of an interposer," and "Remove the photoresist layer from the interposer having the at least one depression formed therein," respectively. The interposer may be subjected to a suitable etch operation to etch through the developed openings formed in the photoresist layer to form the at least one depression in the interposer. Removal of the photoresist layer may be performed using any suitable solvent or chemical.

From block 908, method 900 may proceed to block 910, "Couple a die to the surface of the interposer." Any suitable attachment method may be used including, for example, adhesive, solder paste, or the like. Then, the method 900 may proceed to block 912, "Couple the interposer to a lead frame using a plurality of bond wires, avoiding at least one corner of the top surface of the interposer." Any suitable wire bonding operation may be used for wire bonding the interposer to the lead frame. In addition, the interposer may also be mechanically attached to the lead frame using, for example, adhesive, solder paste, or the like.

Then, from block 912, method 900 may proceed to block 914, "Apply an encapsulant material over the die and the interposer such that the encapsulant material is disposed within the at least one depression." Any suitable encapsulation material may be used including, for example, a resin, epoxy, or the like.

FIGS. 10-14 illustrate cross-sectional views of various stages of an apparatus comprising an interposer including at least one depression in a surface of the interposer, manufactured with an example method, arranged according to at least some embodiments described herein.

Figure 10:
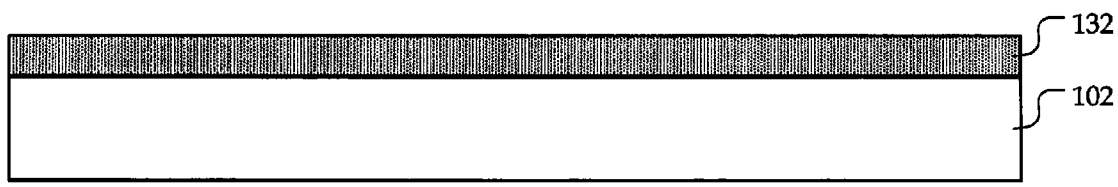
FIGS. 10-15 illustrate cross-sectional views of various stages of an apparatus comprising an interposer including at least one depression in a surface of the interposer, manufactured with an example method.
Figure 11:
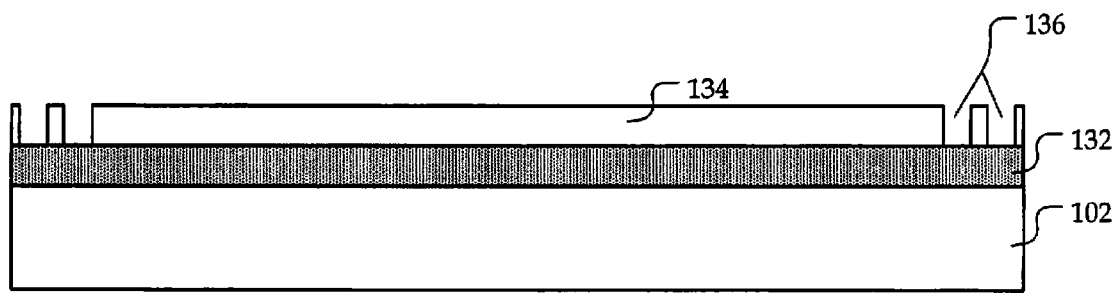

As illustrated in FIG. 10, an interposer 102 may be provided. A photoresist layer 132 or other mask layer may be formed on the interposer 102 as illustrated. A mask 134 may be used to pattern the photoresist layer 132 as illustrated in FIG. 11. The mask 134 may include opening 136 corresponding to locations at which the at least depression in the interposer 102 is desired. The photoresist layer 132 may then be exposed to suitable activation energy (not illustrated).

Figure 12:
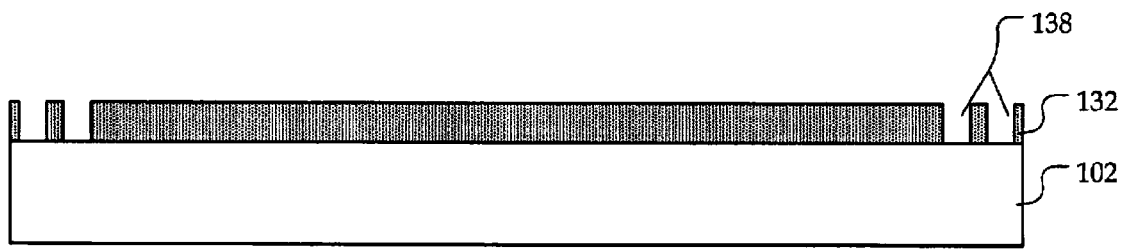
Figure 13:
Figure 14:
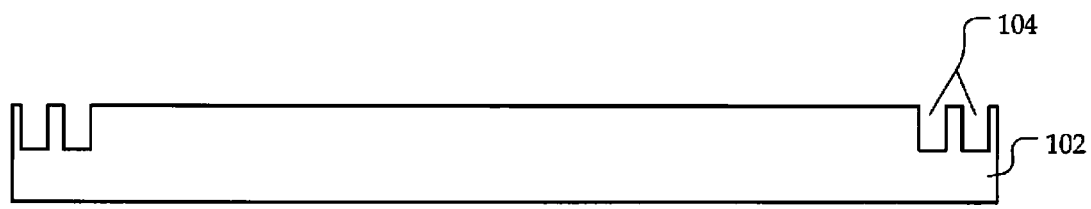

After exposure, the mask 134 may be removed, and the photoresist layer 132 developed to provide openings 138 in the photoresist layer 132, as illustrated in FIG. 12. The interposer 102 may then be etched through the openings 138 to form depressions 104 corresponding to locations of the openings 138, as illustrated in FIG. 13, and the photoresist layer 132 may be removed, as illustrated in FIG. 14.

Figure 15:
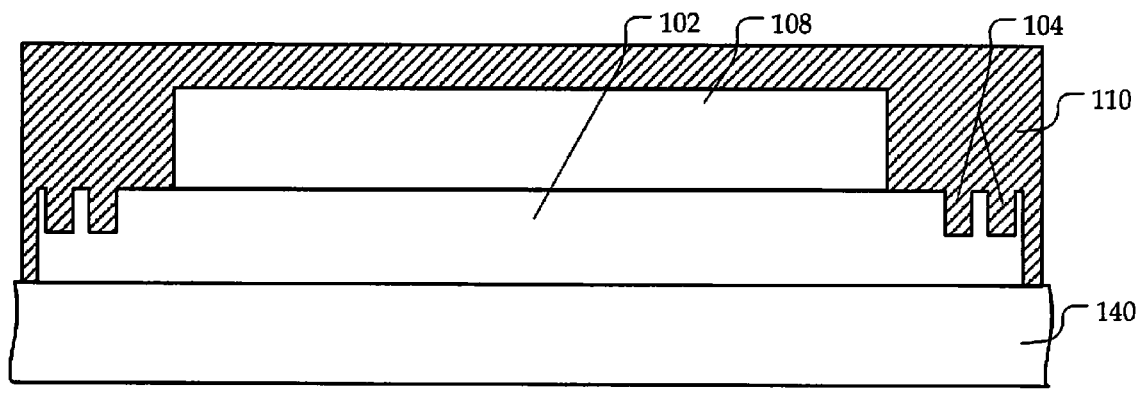

A die 104 may then be coupled to the interposer 102, and the interposer 102 may be coupled to a die paddle 140 of a lead frame, as illustrated in FIG. 15. Although not illustrated, the various wire-bonds may then be formed. An encapsulant material 110 may then be applied over the die 104 and the interposer 102 such that the encapsulant material 110 is disposed within the depressions 104.

Figure 16:
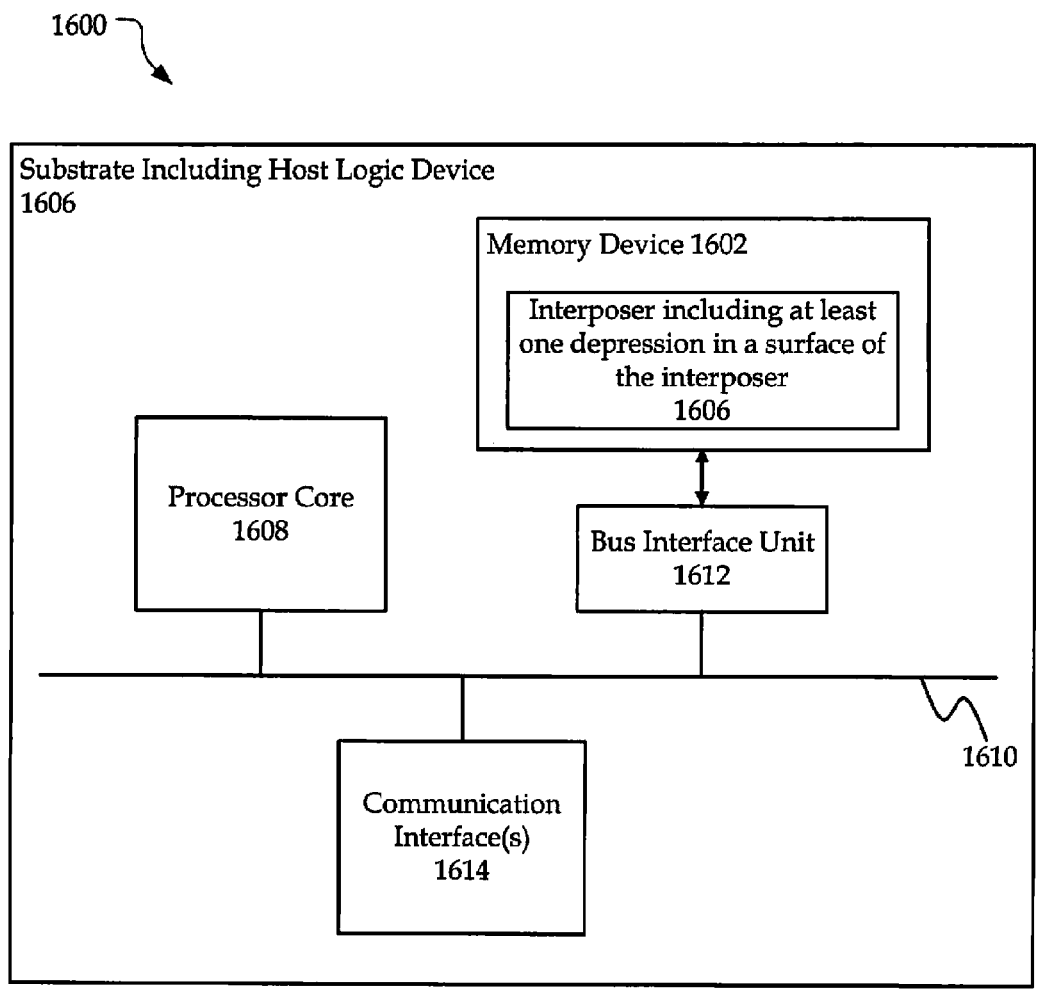
FIG. 16 is a block diagram of an example system including an apparatus comprising an interposer including at least one depression in a surface of the interposer.

Embodiments of apparatuses described herein may be incorporated into various other apparatuses and systems, including but are not limited to various computing and/or consumer electronic devices/appliances, such as desktop or laptop computers, servers, set-top boxes, digital reorders, game consoles, personal digital assistants, mobile phones, digital media players, and digital cameras. A block diagram of an exemplary system 1600 is illustrated in FIG. 16. As illustrated, the system 1600 may include a memory device 1602. In various embodiments, memory device 1602 may be a volatile or a non-volatile memory device. In various embodiments, memory device 1602 may be a NAND, NOR, or phase change non-volatile flash memory device. In various embodiments, the memory device 1602 may include a memory apparatus comprising an interposer 1506 including at least one depression in a surface of the interposer. The interposer 1506 may include, for example, the interposer 102 described herein with reference to FIGS. 1-15.

In various embodiments, memory device 1602 may be operatively coupled to a host logic device 1606. In various embodiments, the host logic device 1606 may be mounted to the same substrate memory device 1602 is mounted. In other embodiments, memory device 1602 may be joined with host logic device 1602. In various embodiments, the host logic device 1606 may be a microcontroller, a digital signal processor or a general purpose microprocessor. In various embodiments, host logic device 1606 may include a processor core 1608, or a plurality of processor cores 1608.

In various embodiments, the system 1600 may further comprise a host logic device bus 1610 operatively coupling the memory device 1602 and the host logic device bus 1610, including electrically coupling memory device 1602 and the host logic device 1606. In various embodiments, host logic device bus 1610 may be disposed on a substrate to which both memory 1602 and host logic device 1606 are mounted.

In various embodiments, the system 1600 may further include communications interface(s) 1614 to provide an interface for system 1600 to communicate over one or more networks and/or with any other suitable device. Communications interface(s) 1614 may include any suitable hardware and/or firmware. Communications interface(s) 1614 for one embodiment may include, for example, a network adapter, a wireless network adapter, a telephone modem, and/or a wireless modem. For wireless communications, communications interface(s) 1614 for one embodiment may use one or more antennas (not illustrated).

With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Various operations may be described as multiple discrete operations in turn, in a manner that may be helpful in understanding embodiments; however, the order of description should not be construed to imply that these operations are order-dependent. Also, embodiments may have fewer operations than described. A description of multiple discrete operations should not be construed to imply that all operations are necessary. Also, embodiments may have fewer operations than described. A description of multiple discrete operations should not be construed to imply that all operations are necessary.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method of manufacturing a semiconductor device package, the method comprising:
    forming at least one depression in a top surface of an interposer, wherein the interposer includes a soldermask, and wherein forming the at least one depression includes forming an opening in a portion of the top surface located in a gap between first and second bond pads at the top surface and such that the opening extends from a surface of the soldermask to an underlying metal region of the interposer;
    coupling a die to the top surface of the interposer; and
    disposing an encapsulant over the die and the interposer, and such that the encapsulant is disposed within the at least one depression.

2. The method of claim 1 wherein forming the at least one depression further includes exposing a surface of the metal region through the opening.

3. The method of claim 1, further comprising:
    coupling one end of a first bond wire to a leadframe and an opposite end of the first bond wire to the first bond pad; and
    coupling one end of a second bond wire to the leadframe and an opposite end of the second bond wire to the second bond pad.

4. The method of claim 1 wherein the die includes a memory die.

5. The method of claim 1 wherein forming the at least one depression includes forming a circular-shaped depression.

6. The method of claim 1 wherein forming the at least one depression includes forming an L-shaped depression.

7. The method of claim 1 wherein forming the at least one depression includes forming a plurality of square-shaped depressions.

8. A method of manufacturing a semiconductor device package, the method comprising:
    forming at least one depression in a top surface of an interposer, wherein the interposer includes a soldermask, wherein forming the at least one depression includes forming an opening in a portion of the top surface located in a gap at a corner of the interposer and between first and second bond pads at the top surface, and wherein the opening extends from a surface of the soldermask to an underlying metal region of the interposer;
    coupling a die to the top surface of the interposer; and
    disposing an encapsulant over the die and the interposer, and such that the encapsulant is disposed within the at least one depression.

9. The method of claim 8 wherein the at least one depression is at least one first depression, and wherein the method further comprises:
    forming a second depression in the gap and between the first depression and the first bond pad; and
    forming a third depression in the gap and between the first depression and the second bond pad.

10. The method of claim 8 wherein forming the at least one depression further includes exposing a surface of the metal region through the opening.

11. The method of claim 8 wherein the die includes a memory die.

12. The method of claim 8, further comprising:
    coupling one end of a first bond wire to a leadframe and an opposite end of the first bond wire to the first bond pad; and
    coupling one end of a second bond wire to the leadframe and an opposite end of the second bond wire to the second bond pad.

13. A method of forming a semiconductor device package, the method comprising:
    forming a first bond pad on an interposer and adjacent a first peripheral edge at a corner of the interposer;
    forming a second bond pad on the interposer and adjacent a second peripheral edge at the corner of the interposer;
    forming at least one depression in a soldermask of the interposer, wherein the at least one depression is located in a gap between the first and second bond pads, and wherein the at least one depression extends from a surface of the soldermask to an underlying metal region of the interposer;
    attaching a die to the interposer; and
    disposing an encapsulant over the die and the interposer, and such that the encapsulant is disposed within the at least one depression.

14. The method of claim 13 wherein the die includes a memory die.

* * * * *